(12) United States Patent
Komatsuda (10) Patent No.: US 8,081,296 B2
(45) Date of Patent: Dec. 20, 2011

(54) ILLUMINATION OPTICAL APPARATUS, EXPOSURE APPARATUS, AND DEVICE MANUFACTURING METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 428 days.

(21) Appl. No.: 12/170,933

(22) Filed: Jul. 10, 2008

(65) Prior Publication Data

US 2009/0046265 A1 Feb. 19, 2009

Related U.S. Application Data

(60) Provisional application No. 60/935,375, filed on Aug. 9, 2007.

(51) Int. Cl.
*G03B 27/72* (2006.01)
*G03B 27/58* (2006.01)
*G03B 27/54* (2006.01)

(52) U.S. Cl. .................. 355/71; 355/74; 355/67

(58) Field of Classification Search ............ 355/53, 355/66, 77, 67, 71, 74
See application file for complete search history.

(56) References Cited

U.S. PATENT DOCUMENTS

| | | | |
|---|---|---|---|
| 5,486,896 A * | 1/1996 | Hazama et al. | ............. 355/71 |
| 5,636,003 A * | 6/1997 | Tanitsu et al. | ............. 355/67 |
| 5,895,737 A | 4/1999 | McCullough et al. | |
| 6,104,474 A | 8/2000 | Suzuki | |
| 6,356,341 B1 | 3/2002 | Murakami et al. | |
| 6,452,661 B1 | 9/2002 | Komatsuda | |
| 2002/0186811 A1* | 12/2002 | Weiss et al. | ............. 378/34 |
| 2003/0067591 A1* | 4/2003 | Komatsuda | ............. 355/67 |
| 2005/0083503 A1* | 4/2005 | Antoni et al. | ............. 355/67 |
| 2007/0014112 A1* | 1/2007 | Ohya et al. | ............. 362/268 |
| 2010/0141922 A1* | 6/2010 | Komatsuda | ............. 355/71 |

FOREIGN PATENT DOCUMENTS

EP 0 744 663 A1 11/1996
EP 0 985 976 A2 3/2000

* cited by examiner

*Primary Examiner* — Edward Glick
*Assistant Examiner* — Deoram Persaud
(74) *Attorney, Agent, or Firm* — Finnegan, Henderson, Farabow, Garrett & Dunner, L.L.P.

(57) ABSTRACT

An illumination optical apparatus of the present invention includes an illumination optical system having a plurality of reflection mirrors arranged to guide illumination light flux to an irradiated plane. A first partial field stop is arranged in an optical path of the illumination optical system to form a first profile line of an illumination region that is to be formed on the irradiated plane. A second partial field stop is arranged between the illumination optical system and the irradiated plane to form a second profile line of the illumination region. The illumination optical system includes a relay optical system for substantially optically conjugating the position of the first partial field stop and the position of the second partial field stop.

18 Claims, 10 Drawing Sheets

ILLUMINATION OPTICAL APPARATUS, EXPOSURE APPARATUS, AND DEVICE MANUFACTURING METHOD

CROSS-REFERENCE TO RELATED APPLICATIONS

This application claims the benefit of priority from U.S. Provisional Patent Application No. 60/935,375, filed on Aug. 9, 2007.

BACKGROUND OF THE INVENTION

The present invention relates to an illumination optical apparatus, an exposure apparatus, and a device manufacturing method. More particularly, the present invention relates to a reflection type illumination optical apparatus optimal for use in an exposure apparatus for manufacturing devices in a lithography process, such as a semiconductor element, imaging element, liquid crystal display element, and thin-film magnetic head.

In the prior art, in an exposure apparatus for manufacturing semiconductor elements and the like, a circuit pattern is formed on a mask (reticle) and thereafter projected and transferred onto a photosensitive substrate (e.g., wafer) through a projection optical system. Resist is applied to the photosensitive substrate. The resist is photosensitized by projection and exposure performed by a projection optical system. This obtains a resist pattern corresponding to a mask pattern. The resolution of the exposure apparatus is dependent on the wavelength of exposure light and the numerical aperture of the projection optical system.

In other words, the wavelength of the exposure light must be shortened and the numerical aperture of the projection optical system must be increased to improve the resolution of the exposure apparatus. It is generally difficult to increase the numerical aperture of the projection optical system to a level that is greater than or equal to a predetermined value from the viewpoint of optical design. Thus, the wavelength of the exposure light must be shortened. Accordingly, EUVL (Extreme Ultra-Violet Lithography) is gathering attention as a next-generation exposure method (exposure apparatus) for semiconductor patterning.

An EUVL exposure apparatus uses EUV (Extreme Ultra-Violet) light having a wavelength of about 5 to 20 nm, which is shorter that in the exposure method of the prior art that uses KrF excimer laser light having a wavelength of 248 nm or an ArF excimer laser light having a wavelength of 193 nm. When using EUV light as the exposure light, there is no usable light transmissive optical material. Thus, a reflection type optical integrator, a reflective mask (generally, reflective raw plate), and a reflection type projection optical system are used in the EUVL exposure apparatus (for example, refer to patent document 1).

[Patent document 1] U.S. Pat. No. 6,452,661

SUMMARY OF THE INVENTION

In the EUVL exposure apparatus, for example, an elongated and arcuate static exposure region is provided for an image plane of a reflection type projection optical system, and a mask pattern is scanned and exposed (scanning exposure) onto the photosensitive substrate while relatively moving a mask and a photosensitive substrate with respect to the projection optical system. Therefore, a field stop for forming the static exposure region must be arranged at a position that is substantially in optical conjugation with the photosensitive substrate, such as a position in the vicinity of the mask.

Specifically, the field stop arranged in the vicinity of the mask includes a first partial field stop, which forms one of the arcuate profile lines of the static exposure region by limiting the light flux entering the mask, and a second partial field stop, which forms the other one of the arcuate profile lines of the static exposure region by limiting the light flux reflected by the mask. The first partial field stop and the second partial field stop are arranged on the same plane in accordance with the concept of a field stop for a normal optical system, that is, along the same plane that is parallel to the mask and in the vicinity of the mask.

In this case, the second partial field stop blocks or shields part of the light reflected by the mask, that is, part of the light directed towards the photosensitive substrate and including the information of the mask pattern. Thus, the shielding of light by the second partial field stop tends to adversely affect the imaging of a pattern on the photosensitive substrate. The adverse affect on imaging is reduced by decreasing the distance between the second partial field stop and the mask. However, the mask moves relative to the field stop. Thus, it is extremely difficult to decrease the distance between the mask and the second partial field stop to zero, and the adverse affect on imaging remains as a matter of fact.

It is an object of the present invention to provide an illumination optical apparatus that is capable of sufficiently reducing the adverse affects on imaging caused by the field stop when applied to an exposure apparatus that uses a reflective raw plate. It is another object of the present invention to provide an exposure apparatus that is capable of performing exposure under satisfactory exposure conditions using an illumination optical apparatus that sufficiently reduces adverse affects on imaging caused by the field stop.

According to a first aspect exemplifying the present invention, there is provided an illumination optical apparatus that illuminating an irradiated plane and forming an illumination region on the irradiated plane, comprising: an illumination optical system including a plurality of reflection mirrors arranged to guide illumination light flux to the irradiated plane; a first partial field stop arranged in an optical path of the illumination optical system and forming a first profile line of the illumination region that is to be formed on the irradiated plane; and a second partial field stop arranged between the illumination optical system and the irradiated plane and forming a second profile line of the illumination region; wherein the illumination optical system includes a relay optical system which substantially optically conjugates a position of the first partial field stop and a position of the second partial field stop.

According to a second aspect exemplifying the present invention, there is provided an exposure apparatus, comprising: an illumination optical apparatus according to the first aspect; and a projection optical system which forms an image of a reflective raw plate, arrangeable on the irradiated plane, on a photosensitive substrate that is arrangeable on a projection plane.

According to a third aspect exemplifying the present invention, there is provided a device manufacturing method, comprising: exposing a pattern of the reflective raw plate on the photosensitive substrate using the exposure apparatus according to the second aspect; and developing the photosensitive substrate that has undergone the exposing.

For example, when an illumination optical apparatus according to the present invention is applied to an exposure apparatus that uses a reflective raw plate, the first partial field stop and the second partial field stop both limit part of the light flux entering the reflective raw plate but do not limit part of the reflected light flux from the reflective raw plate. Thus, adverse affects on the imaging of a pattern at a photosensitive substrate by the limitation of light flux with the partial field stops can be reduced or prevented.

When used for an exposure apparatus, an illumination optical apparatus according to the present invention provides satisfactory exposure conditions. Accordingly, an exposure apparatus according to the present invention using an illumination optical apparatus according to the present invention can manufacture a device having satisfactory performance by performing exposure under satisfactory exposure conditions.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

One embodiment according to the present invention will now be discussed with reference to the appended drawings.

Figure 1:
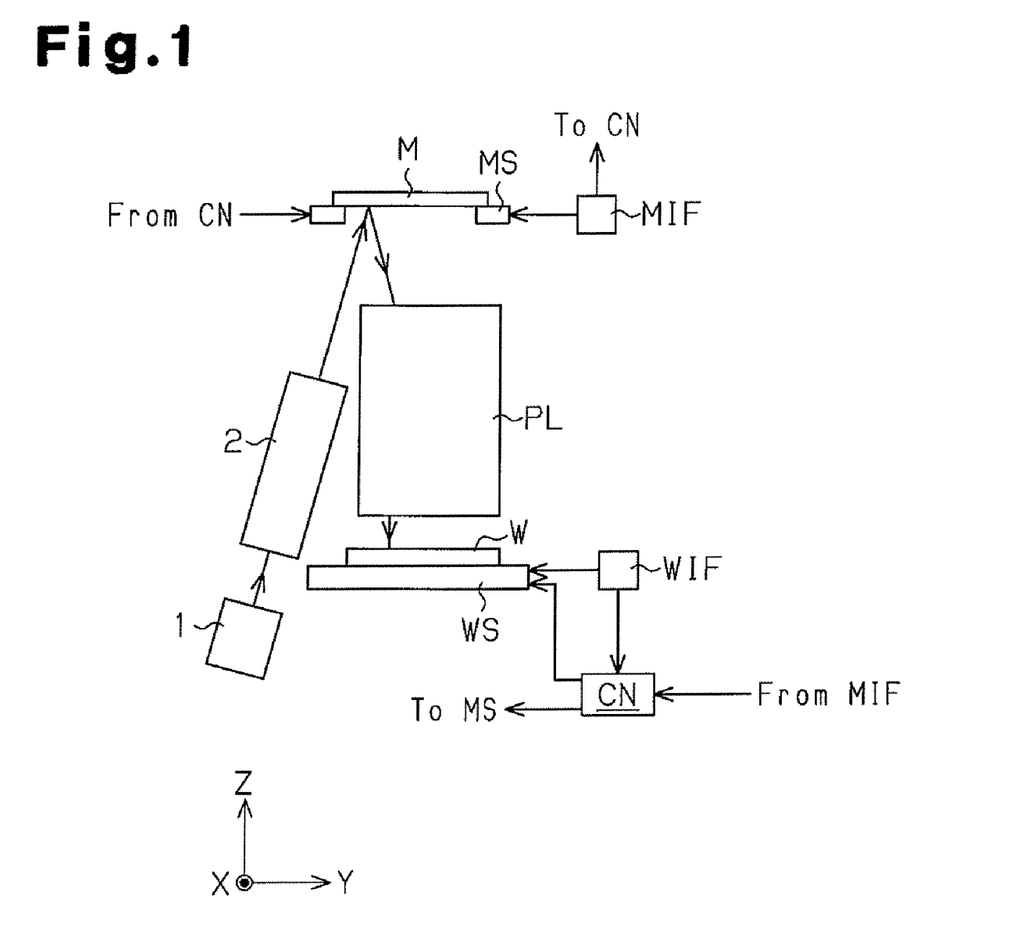
FIG. 1 is a schematic diagram showing the entire structure of an exposure apparatus according to one embodiment of the present invention.
Figure 2:
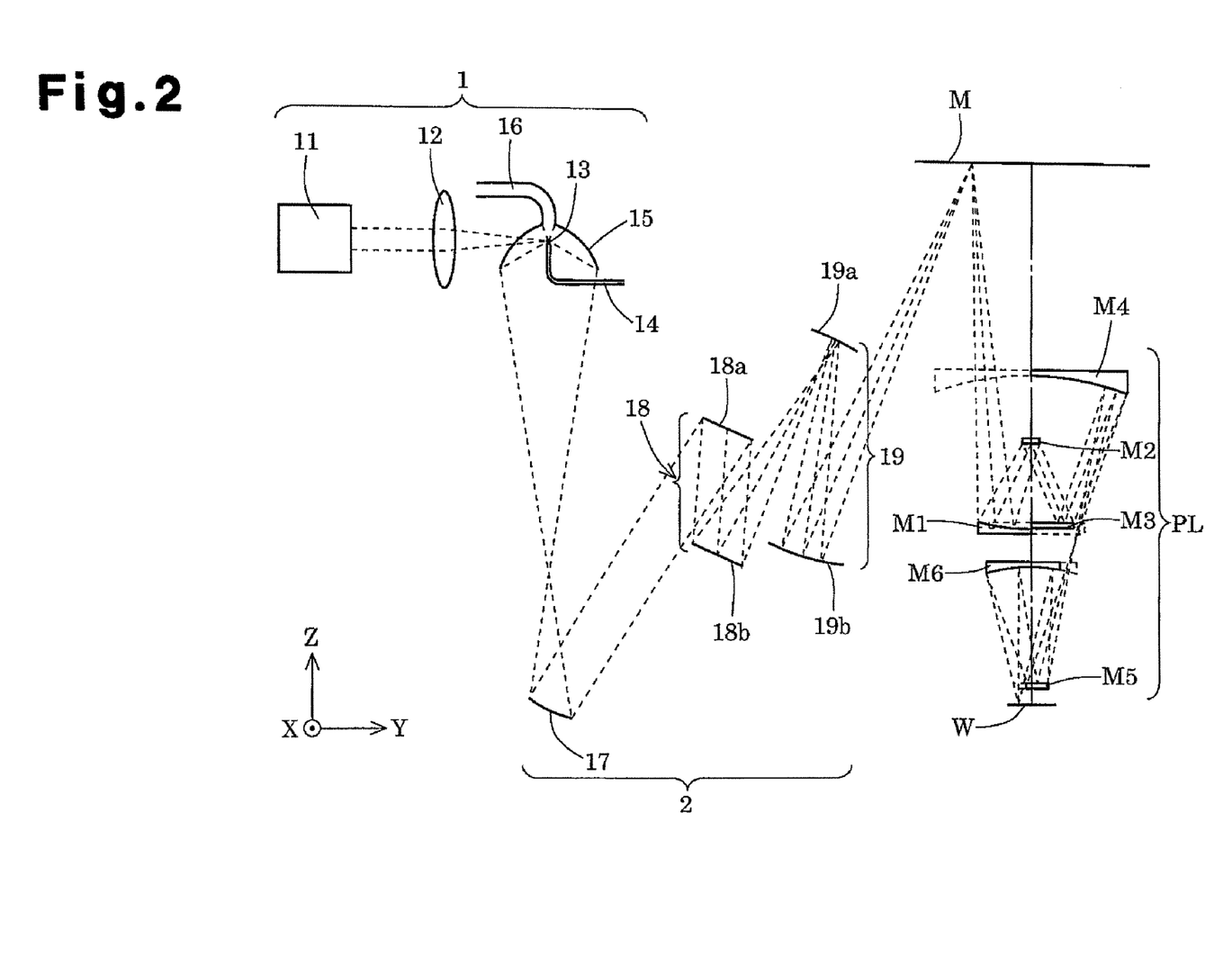
FIG. 2 is a schematic diagram showing the inner structure of a light source, an illumination optical system, and a projection optical system of FIG. 1.

FIG. 1 is a schematic diagram showing the entire structure of an exposure apparatus according to one embodiment of the present invention. FIG. 2 is a schematic diagram showing the inner structure of a light source, an illumination optical system, and a projection optical system of FIG. 1. In FIG. 1, a Z-axis is set along an optical axis direction of the projection optical system, that is, a normal direction of a wafer, or a photosensitive substrate. A Y-axis is set in a direction parallel to the plane of FIG. 1 in the wafer surface. Further, an X-axis is set in a direction perpendicular to the plane of FIG. 1 in the wafer surface.

Referring to FIG. 1, for example, the exposure apparatus of the present embodiment includes a laser plasma light source 1, which serves as a light source for supplying exposure light. The light source 1 emits light that enters an illumination optical system 2 through a wavelength selection filter (not shown). In the light emitted from the light source 1, the wavelength selection filter functions to selectively transmit only EUV light having a predetermined wavelength (e.g., 13.4 nm) and shields light having other wavelengths. The EUV light transmitted through the wavelength selection filter illuminates a reflective mask (reticle) M having a pattern that is to be transferred through the illumination optical system 2.

The mask M is held by a mask stage MS so that the pattern surface of the mask M extends along the XY plane. The mask stage MS is movable along the Y-direction. The movement is measured by a laser interferometer MIF. The light from the pattern of the illuminated mask M forms an image of the mask pattern on a wafer W, which is a photosensitive substrate, through a reflection type projection optical system PL. That is, an arcuate static exposure region (effective exposure region) that is symmetric with respect to the Y-axis is formed on the wafer W, as will be described later.

The wafer W is held by a wafer stage WS so that the exposure surface of the wafer W extends along the XY plane. The wafer stage WS is movable in a two-dimensional manner along the X-direction and the Y-direction. The movement is measured by a laser interferometer WIF in the same manner as the mask stage MS. The measurement result of the laser interferometer MIF and the measurement result of the laser interferometer WIF are provided to a control unit CN. The control unit CN controls the movement of the mask stage MS and the wafer stage WS in the Y-direction.

The pattern of the mask M is transferred onto one of the rectangular shot regions on the wafer W by performing scanning exposure (scan and expose) while relatively moving the mask M and the wafer W along the Y-direction with respect to the projection optical system PL. If the projection magnification (transfer magnification) of the projection optical system PL is, for example, ¼, the movement speed of the wafer stage WS is set to ¼ the movement speed of the mask stage MS to perform synchronous scanning. The pattern of the mask M is sequentially transferred to each shot region on the wafer W by repeating the scanning exposure while moving the wafer stage WS in a two-dimensional manner in the X-direction and the Y-direction.

Referring to FIG. 2, the laser plasma light source 1 shown in FIG. 1 includes a laser light source 11, a condenser lens 12, a nozzle 14, an elliptical reflection mirror 15, and a duct 16. The light (non-EUV light) emitted from the laser light source 11 is converged on a gas target 13 by the condenser lens 12. The gas target 13 is gas, for example, xenon (Xe) gas, supplied from a high pressure gas source to the nozzle 14 and ejected from the nozzle 14, and is and the like. The gas target 13 obtains energy from the converged laser light flux. As a result, the gas target 13 becomes plasmatic and emits EUV light. The gas target 13 is positioned at a first focal point on the elliptical reflection mirror 15.

The EUV light emitted from the laser plasma light source 1 is converged at a second focal point of the elliptical reflection mirror 15. The gas that has emitted light is drawn into the duct 16 and guided outside. The EUV light converged at the second focal point of the elliptical reflection mirror 15 is converted to substantially parallel light by a concave reflection mirror 17 and guided to an optical integrator 18, which includes two fly's eye optical systems 18a and 18b.

Figure 3A:
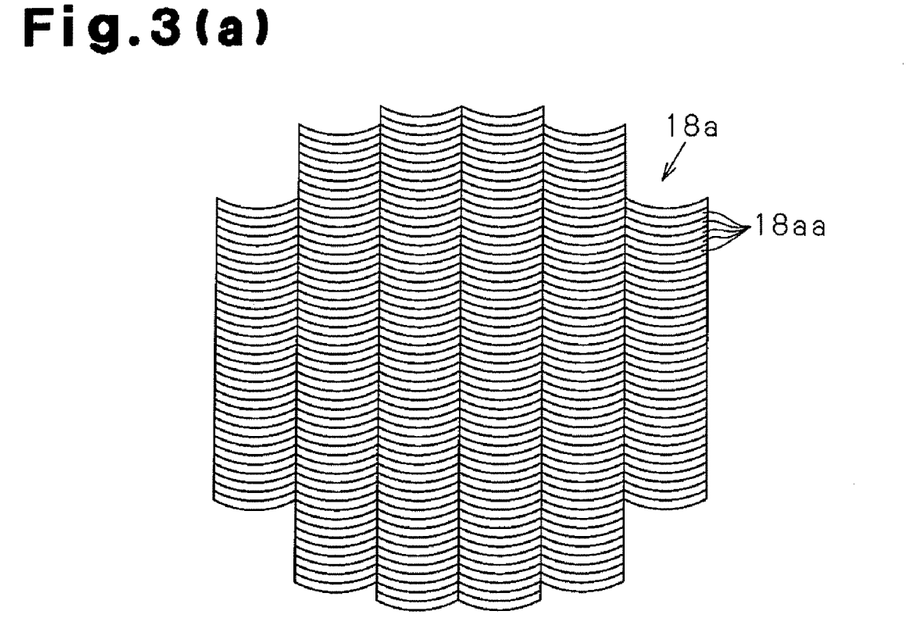
FIG. 3 is a schematic diagram showing an example of an optical integrator of FIG. 2.
Figure 3B:
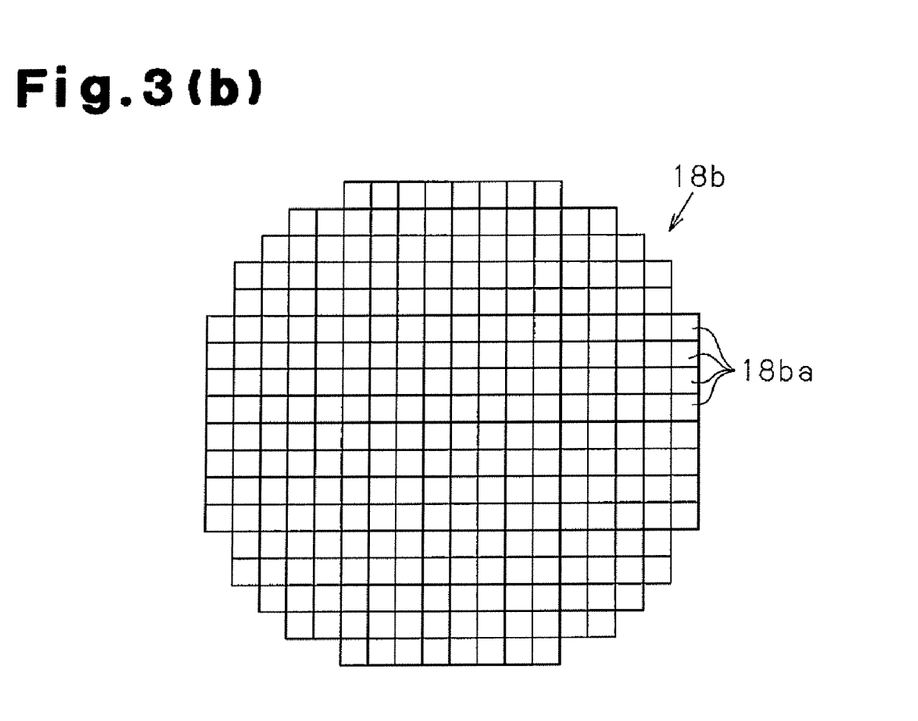

The first fly's eye optical system 18a is formed, for example, by a plurality of reflection mirror elements 18aa, which have an arcuate profile and are arranged in parallel as shown in FIG. 3(a). The second fly's eye optical system 18b is formed by a plurality of reflection mirror elements 18ba arranged in parallel, with each second fly's eye optical system 18b corresponding to one of the plurality of reflection mirror elements 18aa in the first fly's eye optical system 18a. As shown in FIG. 3(b), each reflection mirror element 18ba has a rectangular profile. U.S. Pat. No. 6,452,661 is incorporated herein by reference as much as possible as part of the present invention with regard to the specific structure and operation of the first fly's eye optical system 18a and the second fly's eye optical system 18b.

A substantive planar light source having a predetermined shape is formed near an emission plane of the optical integrator 18, that is, near the reflection plane of the second fly's eye optical system 18b. The substantive planar light source is formed at an exit pupil position of the illumination optical system 2, that is, at a position optically conjugated to an entrance pupil of the projection optical system PL. An aperture stop AS (not shown in FIG. 2) is arranged in the vicinity of the reflection plane of the second fly's eye optical system 18b.

Light from the substantive planar light source is limited by the aperture stop AS and then emitted from the illumination optical system 2 through a condenser optical system 19 formed by a concave reflection mirror 19a and a concave reflection mirror 19b. The condenser optical system 19 is formed such that the light from each of the plurality of reflection mirror elements 18ba in the second fly's eye optical system 18b illuminates the mask M in a superimposed manner. The light emitted from the illumination optical system 2 forms an arcuate illumination region on the mask M. Thus, the light source 1 (11 to 16) and the illumination optical system 2 (17 to 19) form an illumination system (illumination optical apparatus) for performing Köhler illumination on the mask M having a predetermined pattern.

The light from the pattern of the illuminated mask M forms an image of the mask pattern in the arcuate static exposure region on the wafer W through the projection optical system PL. The projection optical system PL includes a first catoptric optical system, which forms an intermediate image of the pattern of the mask M, and a second catoptric optical system, which forms an image of the intermediate image of the mask pattern (secondary image of the pattern of the mask M) on the wafer W. The first catoptric optical system is formed by four reflection mirrors M1 to M4, and the second catoptric optical system is formed by two reflection mirrors M5 and M6. The projection optical system PL is an optical system telecentric at the wafer side (image side).

Figure 4:
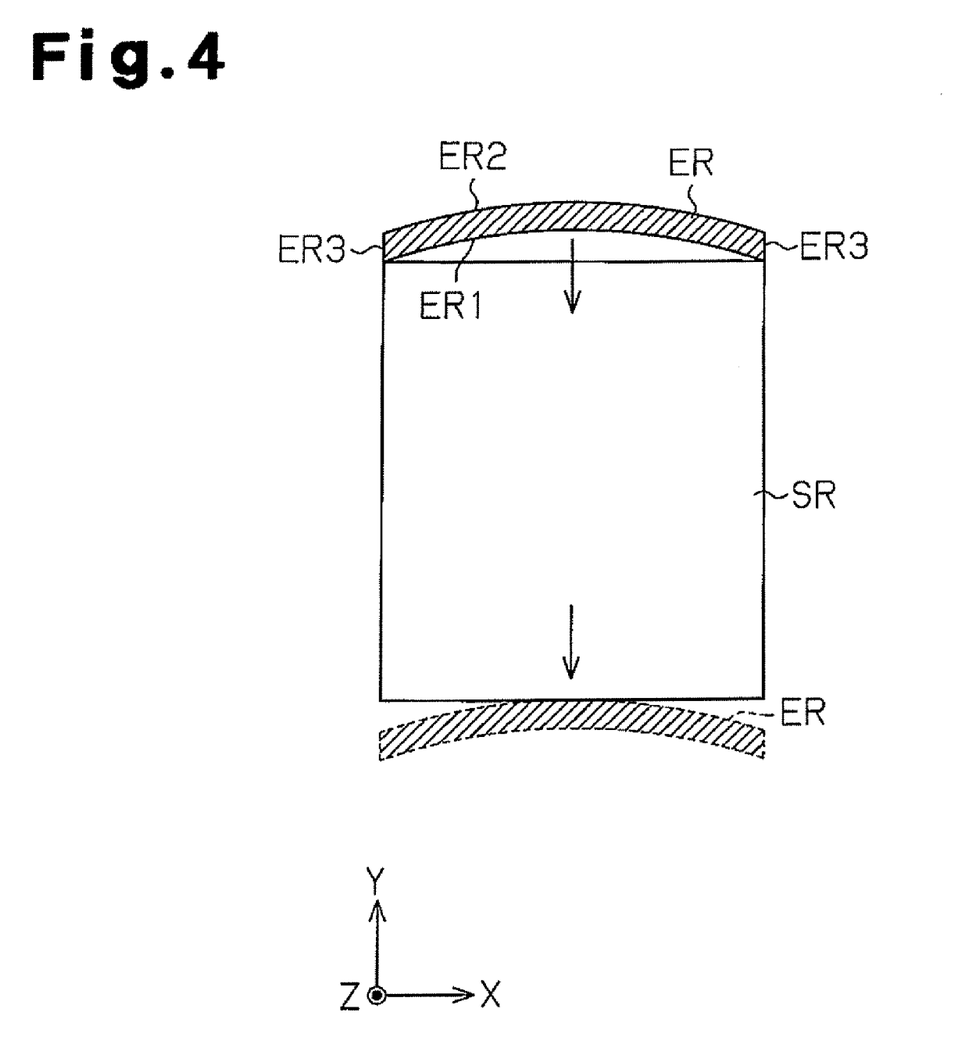
FIG. 4 is a schematic diagram showing a single scanning exposure in the present embodiment.

FIG. 4 is a view schematically describing a single scanning exposure in the present embodiment. With reference to FIG. 4, an arcuate static exposure region (effective exposure region) ER symmetric with respect to the Y-axis is formed so as to correspond to the arcuate effective imaging region and the effective field of the projection optical system PL in the exposure apparatus of the present embodiment. The arcuate static exposure region ER moves from a scanning start position, shown with a solid line in the figure, to a scanning end position, shown with a broken line in the figure, while transferring the pattern of the mask M to one rectangular shot region SR of the wafer W by a single scanning exposure (scan and expose). In the illustrated embodiment, the arcuate static exposure region ER may have four sides defined by two opposing arcuate profile lines ER1, ER2 and two opposing linear profile lines ER3.

Figure 5:
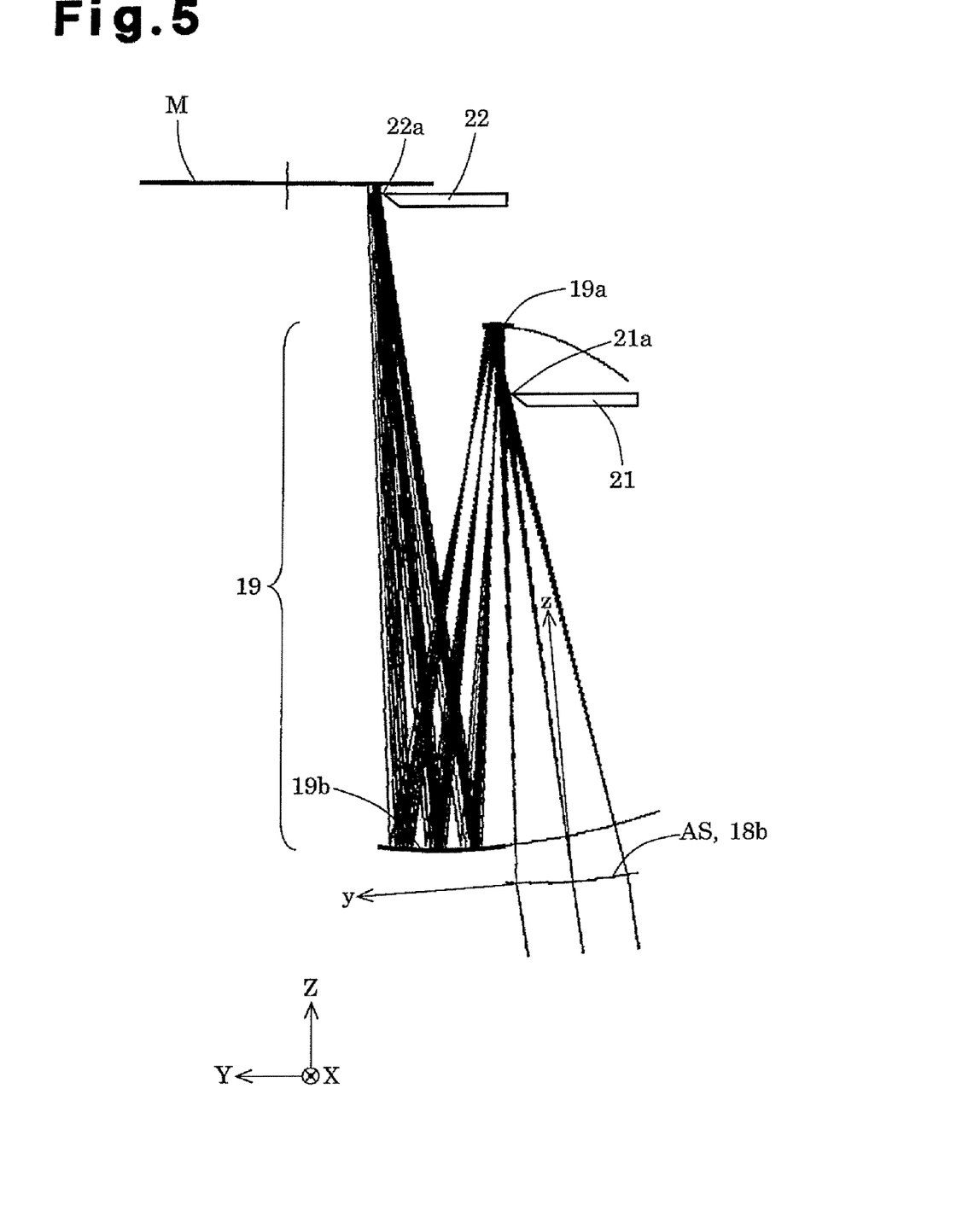
FIG. 5 is a schematic side view showing the main parts of the illumination system in the present embodiment.

FIG. 5 is a schematic side view showing the main parts of the illumination system in the present embodiment. Referring to FIG. 5, a first partial field stop 21, which limits the light flux entering the mask M, is arranged in an optical path between the second fly's eye optical system 18b of the optical integrator 18 and the concave reflection mirror 19a of the condenser optical system 19. A second partial field stop 22, which limits the light flux entering the mask M, is arranged near the mask M, that is, in an optical path between the concave reflection mirror 19b and the mask M.

Figure 6A:
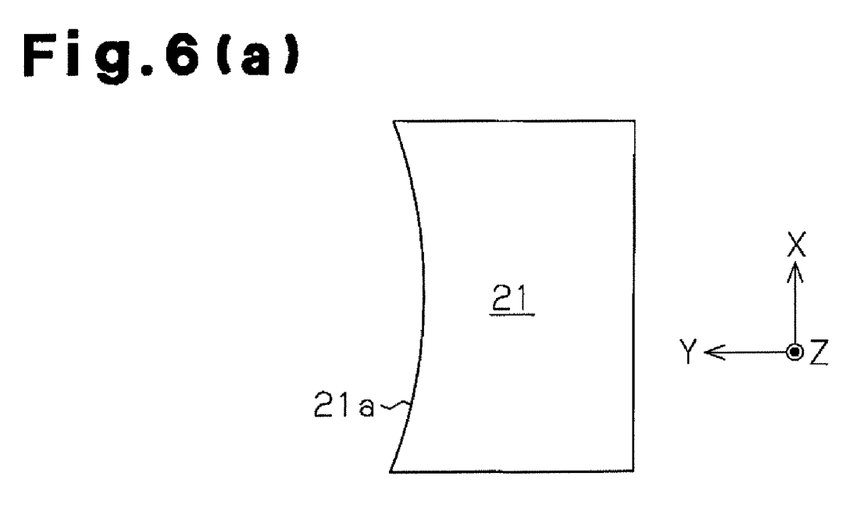
FIG. 6 is a plan view schematically showing the structure of a field stop in the present embodiment.
Figure 6B:
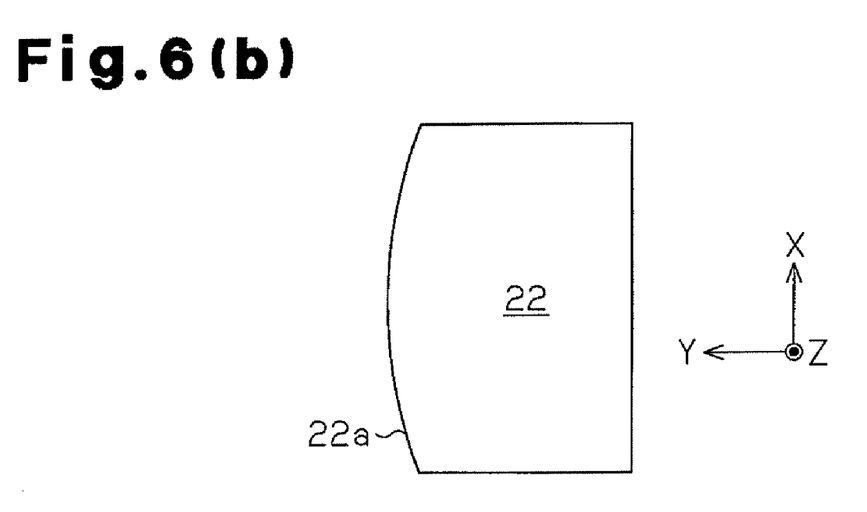

As shown in FIG. 6(a), the first partial field stop 21 has an edge 21a with a concave arcuate shape in the +Y direction and is arranged to form one arcuate profile line ER1 (see FIG. 4) of the static exposure region ER that is to be formed on the wafer W. As shown in FIG. 6(b), the second partial field stop 22 has an edge 22a with a convex arcuate shape in the +Y direction and is arranged to form the other arcuate profile line ER2 (see FIG. 4) of the static exposure region ER.

A pair of partial field stops (not shown) is arranged near the vicinity of the mask M to form a pair of linear profile lines ER3 extending along the scanning direction (Y direction) of the static exposure region ER. The pair of partial field stops are well known and thereby will not be described in detail. In the present embodiment, the position of the first partial field stop 21 and the position of the second partial field stop 22 are substantially in optical conjugation with the condenser optical system 19, which functions as a relay optical system and includes two normal incidence mirrors (concave reflection mirrors 19a and 19b). Therefore, the pair of partial field stops (not shown) forming the pair of linear profile lines ER3 may be arranged near the first partial field stop 21 instead of near the mask M.

As described above, the first partial field stop 21 is arranged in the optical path of the illumination optical system including the plurality of reflection mirrors (17, 19a, 19b) to form a first profile line (corresponding to the arcuate profile line ER1 of the static exposure region ER) of the illumination region (arcuate illumination region corresponding to the static exposure region ER) that is to be formed on the mask M. The second partial field stop 22 is arranged between the illumination optical system and the mask M to form a second profile line (corresponding to the other arcuate profile line ER2 of the static exposure region ER) of the illumination region.

When assuming that the illumination light flux entering the mask M is projected on the mask M to show a projection track of the illumination light flux, and the direction in which the projection track advances is defined as a positive direction (+Y direction in FIG. 5), the second partial field stop 22 is arranged to shield a light flux part located at the negative direction side of the light flux entering the stop 22. In other words, the second partial field stop 22 is arranged to shield the right part of the light flux that enters the second partial field stop 22 as viewed in FIG. 5. The first partial field stop 21 and the second partial field stop 22 are arranged to shield the light flux from the same side with respect to the same direction (Y direction). In other words, the second partial field stop 22 is arranged to shield the right part of the light flux as viewed in FIG. 5 entering the second partial field stop 22 in the optical path between the second fly's eye optical system 18b and the concave reflection mirror 19a.

In the present embodiment, the second partial field stop 22 arranged in the vicinity of the mask M limits part of the light flux entering the mask M but does not limit part of the light flux reflected by the mask M. Thus, the limitation of the light flux by the second partial field stop 22 will not adversely affect the imaging of a pattern on the wafer W. Accordingly, in order to perform the exposure amount control as described in U.S. Pat. No. 6,104,474, the distance between the second partial field stop 22 and the mask M may be increased so that the arcuate profile line ER2 of the static exposure region ER is blurred by a necessary amount to space the second partial field stop 22 from a position optically conjugated to the wafer W (i.e., pattern surface of the mask M) by a certain extent. The above U.S. patent is incorporated herein by reference to the furthest extend allowed by law to supplement the disclosure presented herein. In this manner, the exposure amount distribution becomes further uniform.

In the same manner, the first partial field stop 21 arranged at a position that is substantially in optical conjugation with the second partial field stop 22 limits part of the light flux entering the mask M. However, the limitation of the light flux by the first partial field stop 21 does not adversely affect the imaging of the pattern on the wafer W. Accordingly, the arcuate profile line ER1 of the static exposure region ER can be blurred by the necessary amount for exposure amount control. That is, the first partial field stop 21 arranged at a position that is substantially in optical conjugation with the second partial field stop 22 may also be spaced from the position conjugated to the mask surface and, ultimately, the position optically conjugated to the wafer W by a necessary amount, similar to the second partial field stop 22. Accordingly, in to the present embodiment, the first and second partial field stops can be arranged so that they do not adversely affect the imaging of a pattern, and each partial field stop can be spaced from the position optically conjugated to the mask surface by the necessary amount for exposure amount control.

In this manner, the illumination optical apparatus (1, 2) of the present embodiment prevents adverse affects on imaging by the partial field stop (21, 22) and deterioration of the exposure amount distribution. Accordingly, in the exposure apparatus of the present embodiment, the use of the illumination optical apparatus (1, 2), which prevents adverse affects on imaging by the partial field stop (21, 22) and deterioration of the exposure amount distribution, allows exposure to be performed under satisfactory exposure conditions. The structure of the main parts of the illumination optical system 2 in the present embodiment will be described in further detail with reference to FIG. 5.

In the present embodiment, the condenser optical system 19, which forms the main part of the illumination optical system 2, includes the concave reflection mirror 19a serving as a normal incidence mirror and the concave reflection mirror 19b serving as a normal incidence mirror arranged in the order in which light enter from the aperture stop AS arranged at substantially the same position as the reflection plane of the second fly's eye optical system 18b. FIG. 5 shows a state in which light flux from an infinitely distant object (not shown) passes through the aperture stop AS and the second fly's eye optical system 18b and first forms an image at the position of the first partial field stop 21 or its vicinity and then forms an image again on the mask M after passing by the concave reflection mirror 19a and the concave reflection mirror 19b. In FIG. 5, a reference axis extending through the center of the opening (light transmission portion) of the aperture stop AS and being perpendicular to the surface of the aperture stop AS is defined as the z-axis. An axis perpendicular to the plane of FIG. 5 and extending along the surface of the aperture stop AS is defined as the x-axis. An axis parallel to the plane of FIG. 5 and extending along the surface of the aperture stop AS is defined as the y-axis. The setting of the coordinates (x, y, z) is in FIG. 7, which will be described below.

The values of data for the main parts of the illumination optical system 2 in the present embodiment are shown in table (1). The data of table (1) is listed in accordance with the format "Code V", which is an optical designing software manufactured by ORA (Optical Research Associates). In the ray tracing set value section of table (1), EPD is the diameter (unit: mm) of the opening of the aperture stop AS. XAN is the x-direction component (unit: degree) of the angle of incidence to the aperture stop AS of fifteen light beams used in ray tracing. YAN is the y-direction component (unit: degree) of the angle of incidence to the aperture stop AS of the fifteen light beams.

In the lens data section of table (1), RDY indicates the radius of curvature of a surface (vertex radius of curvature for an aspheric surface; unit: mm). THI indicates the distance from the surface to the next surface, or surface interval (unit: mm). RMD indicates whether the surface is a reflection surface or a refraction surface. GLA indicates the medium between the surface and the next surface. REFL indicates a reflection surface. INFINITY indicates infinity. If RDY is INFINITY, that surface is a plane. OBJ indicates the surface of an infinitely distant object serving as an object plane. STO indicates the surface of the aperture stop AS. Surface numbers 2 and 3 indicate virtual ultra-thin lenses that are optically equivalent to the reflection mirror elements of the second fly's eye optical system 18b. Since the second fly's eye optical system 18b can be considered as a whole as being a concave mirror having positive power, the power value is expressed as a virtual ultra-thin lens.

Surface number 4 indicates the reflection surface of the concave reflection mirror 19a. Surface number 5 indicates the reflection surface of the concave reflection mirror 19b. Surface number 6 and IMG indicate the pattern surface of the mask M serving as an image plane. SPS XYP indicates that the surface (surface of surface number 2 in lens data) is a freely curved surface expressed by a power series of xy in the equation (1) shown below. The SPS XYP surface is a tenth-order polynomial surface added to a reference Korenich. The polynomial equation is expanded to a monomial equation of $x^m y^n$ (m+n$\leq$10).

Equation 1

$$s = \frac{cr^2}{1+\sqrt{1-(1+k)c^2 r^2}} + \sum_{j=2}^{66} C_j x^m y^n \qquad (1)$$

where, $$j = \frac{\{(m+n)^2 + m + 3n\}}{2} + 1$$

In equation (1), s is the sag amount (unit: mm) of a plane parallel to the z-axis, c is the vertex curvature (unit: mm$^{-1}$), r is the distance from the vertex (value of square root of $x^2+y^2$) (unit: mm), k is a Korenich constant, and Cj is a coefficient of monomial equation $x^m y^n$. In the lens data section of table (1), K is a Korenich constant k. Y is a coefficient of y, X2 is a coefficient of $x^2$, Y2 is a coefficient of $y^2$, X2Y is a coefficient of $x^2 y$, Y3 is a coefficient of $y^3$, X4 is a coefficient of $x^4$, X2Y2 is a coefficient of $x^2 y^2$, Y4 is a coefficient of $y^4$, X4Y is a coefficient of $x^4 y$, X2Y3 is a coefficient of $x^2 y^3$, and Y5 is a coefficient of $y^5$.

In the lens data section of table (1), ASP indicates that the surface (surface of surface numbers 4 and 5 in the lens data) is an aspheric surface represented by the following equation (2).

$$s = (h^2/r)/[1+\{1-(1+\kappa) \cdot h^2/r^2\}^{1/2}] + C_4 \cdot h^4 + C_6 \cdot h^6 + C_8 \cdot h^8 + C_{10} \cdot h^{10} \qquad (2)$$

In equation (2), h is the height (unit: mm) in a direction perpendicular to an optical axis, s is the distance (sag amount) (unit: mm) along the optical axis from a tangent plane at the vertex of an aspheric surface to the position on the aspheric surface at height h, r is a vertex curvature radius (unit: mm), κ is a conical coefficient, and $C_n$ is an aspheric surface coefficient of the nth order. In the lens data section of table (1), K is a conical coefficient κ, A is a coefficient $C_4$ of $h^4$, B is a coefficient $C_6$ of $h^6$, C is a coefficient $C_8$ of $h^8$, and D is a coefficient $C_{10}$ of $h^{10}$.

In the second fly's eye optical system 18b, each reflection mirror element tilts and provides the power of the optical surface corresponding to the free curved surface to the optical system. However, such state cannot be directly expressed in Code V. A state optically equivalent to each reflection mirror element of the second fly's eye optical system 18b is thus expressed using a virtual ultra-thin lens (corresponding to second surface and third surface in the lens data) formed of glass 'kari' having an extremely high index of refraction. The index of refraction of the glass 'kari' is 10000.

For the surface numbers 4 to 6, XDE, YDE, and ZDE indicate the x-direction component (unit: mm), the y-direction component (unit: mm), and the z-direction component (unit: mm) of the eccentricity of a surface. Further, ADE, BDE, and CDE indicate the θx-direction component (rotational component about x-axis; unit: degree), θy-direction component (rotational component about y-axis; unit: degree), and θz-direction component (rotational component about z-axis; unit: degree) of the rotation of a surface. For the surface numbers 4 and 5, DAR indicates that the coordinates (x, y, z) after the surface does not change. In other words, even if the surface indicated as DAR is eccentric, the surface rearward to that surface is not in accordance with the new eccentric coordinates and the eccentricity is an independent eccentricity of only the surface indicated as DAR. The indication in table (1) is the same in the following table (2).

reference axis z, which extends through the center of the opening in the aperture stop AS perpendicular to the surface of the aperture stop AS.

As a result, the pupil axis extending through the center of the exit pupil of the illumination optical system 2 perpendicular to the surface of the exit pupil or the arcuate rotation axis of the illumination region in the mask M is located outside the opening of the aperture stop AS without intersecting the concave reflection mirror 19a and concave reflection mirror 19b of the condenser optical system 19. In the present embodiment, the exit pupil of the illumination optical system 2 and the entrance pupil of the projection optical system PL may be aligned without mechanically interfering the illumination optical system and the projection optical system even if a planar mirror for deflecting the optical path is not arranged in the optical path between the illumination optical system 2 and the reflective mask M. In other words, mechanical interference of the illumination optical system 2 and the projection optical system PL is prevented even if the exit pupil of the illumination optical system 2 and the entrance pupil of the projection optical system PL are aligned. Furthermore, the optical path of the illumination optical system 2 and the optical path of the projection optical system PL are prevented from being overlapped. The rotation symmetric axis and the

TABLE (1)

<<<Ray Tracing Set Value>>>

| EPD | 166.40000 | | | | |
|---|---|---|---|---|---|
| XAN | 0.00000 | 0.00000 | 0.00000 | 0.46553 | 0.46553 |
| | 0.46553 | 0.93110 | 0.93110 | 0.93110 | 1.39672 |
| | 1.39672 | 1.39672 | 1.86244 | 1.86244 | 1.86244 |
| YAN | 4.73228 | 4.87602 | 5.01980 | 4.70990 | 4.85364 |
| | 4.99741 | 4.64215 | 4.78588 | 4.92963 | 4.52707 |
| | 4.67077 | 4.81450 | 4.36106 | 4.50473 | 4.64843 |

<<<Lens Data>>>

| | RDY | TH | RMD | GLA |
|---|---|---|---|---|
| OBJ: | INFINTY | INFINTY | | |
| STO: | 833.13494 | 0.000000 | | |
| 2: | 833.13494 | 0.000000 | | 'kari' |
| SPS XYP: | | | | |
| K: 4.6188E−05 | Y: 1.3338E−06 | X2: −3.4240E−09 | | |
| Y2: −3.2735E−09 | X2Y: 6.2076E−13 | Y3: 7.0758E−13 | | |
| X4: −1.3820E−14 | X2Y2: −3.0355E−14 | Y4: −1.8768E−14 | | |
| X4Y: 3.0059E−18 | X2Y3: 9.8523E−18 | Y5: 1.2828E−17 | | |
| 3: | 833.22730 | 789.807305 | | |
| 4: | −364.70403 | −689.810205 | REFL | |
| ASP: | | | | |
| K: 0.000000 | | | | |
| A: 0.512135E−07 | B: −0.395727E−11 | C: 0.982223E−16 | D: −0.845328E−21 | |
| XDE: 0.000000 | YDE: −108.042431 | ZDE: 0.000000 | DAR | |
| ADE: −38.143024 | BDE: 0.000000 | CDE: 0.000000 | | |
| 5: | 960.28537 | 1000.002899 | REFL | |
| ASP: | | | | |
| K: 0.000000 | | | | |
| A: −0.802933E−10 | B: 0.357499E−15 | C: −0.134622E−20 | D: 0.215556E−26 | |
| XDE: 0.000000 | YDE: −140.131266 | ZDE: 0.000000 | DAR | |
| ADE: 16.050740 | BDE: 0.000000 | CDE: 0.000000 | | |
| 6: | INFINITY | 0.000000 | | |
| XDE: 0.000000 | YDE: 363.354866 | ZDE: 0.000000 | | |
| ADE: −4.128691 | BDE: 0.000000 | CDE: 0.000000 | | |

In the illumination optical system 2 of the present embodiment, the condenser optical system 19 is formed by the concave reflection mirror 19a, which has a rotation aspheric reflection surface, and the concave reflection mirror 19b, which has a rotation aspherical reflection surface. The rotation symmetric axes of the rotation aspherical surface of the concave reflection mirror 19a and the concave reflection mirror 19b is arranged to be angled to and/or separated from a reference axis may intersect with each other but do not necessarily have to intersect each other at one point. In the present specification, the normal incidence mirror refers to a mirror in which the angle between the normal line and light beam at the incident position of the light flux is within 45 degrees.

In the above-described embodiment, the relay optical system that substantially optically conjugates the position of the first partial field stop 21 and the position of the second partial field stop 22 is formed by two normal incidence mirrors (19a and 19b). However, the present invention is not limited in such a manner. For example, in a modification, the relay optical system that substantially optically conjugates the position of the first partial field stop 23 and the position of the second partial field stop 22 may be formed by two normal incidence mirrors (19a and 19b) and an oblique incidence mirror (planar mirror for deflecting the optical path) PM arranged between the two normal incidence mirrors (19a, 19b) and the second partial field stop 22, as shown in FIG. 7.

Figure 7:
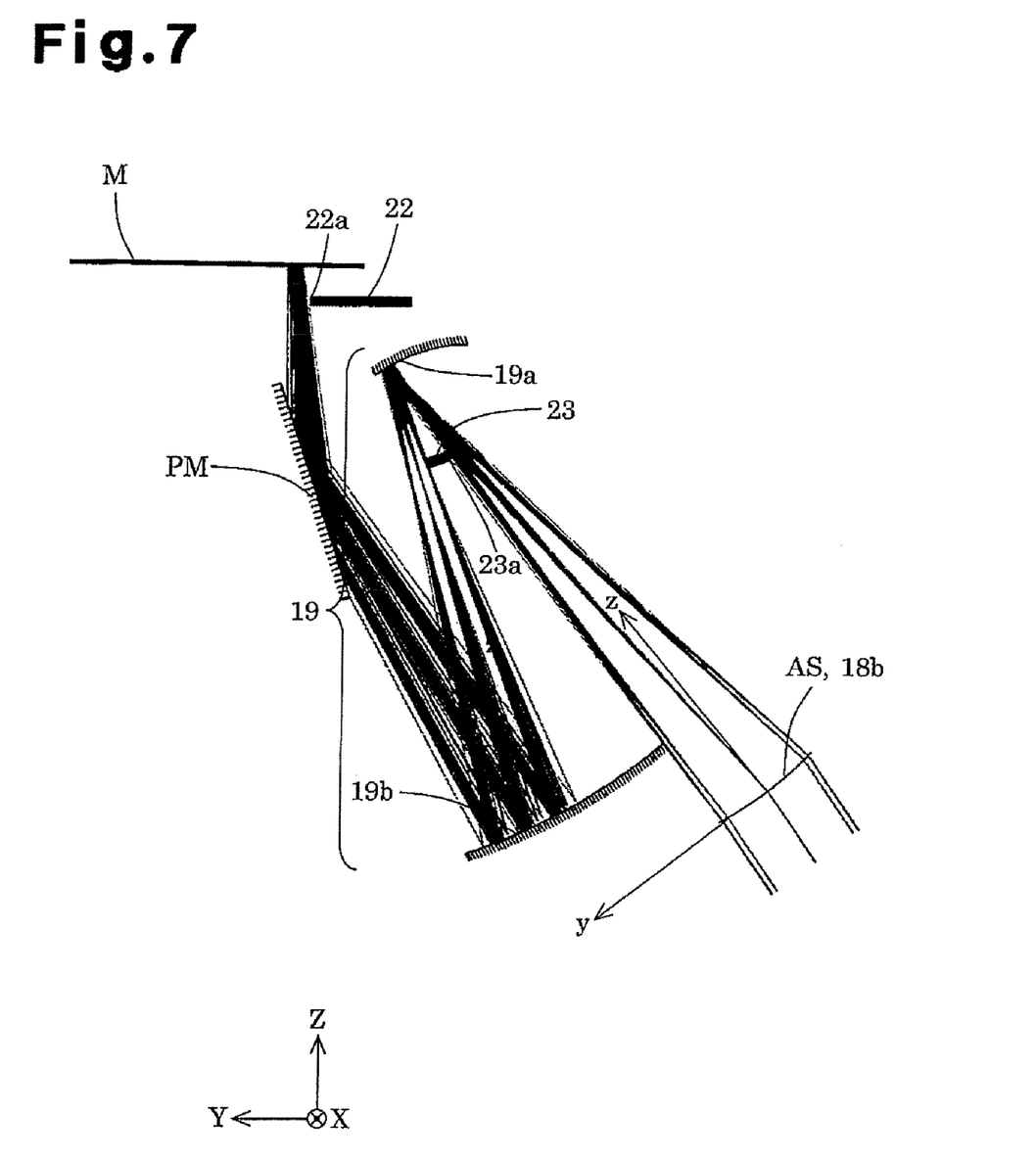
FIG. 7 is a schematic side view showing the main parts of an illumination system in a modification.

In the modification of FIG. 7, the condenser optical system 19 includes the concave reflection mirror 19a, which serves as the normal incidence mirror, and the concave reflection mirror 19b, which serves as the normal incidence mirror. The first partial field stop 23 for limiting the light flux entering the mask M is arranged in an optical path between the second fly's eye optical system 18b of the optical integrator 18 and the concave reflection mirror 19a of the condenser optical system 19. Further, the second partial field stop 22 for limiting the light flux entering the mask M is arranged near the mask M, that is, in the optical path between the planar mirror PM and the mask M.

Figure 8A:
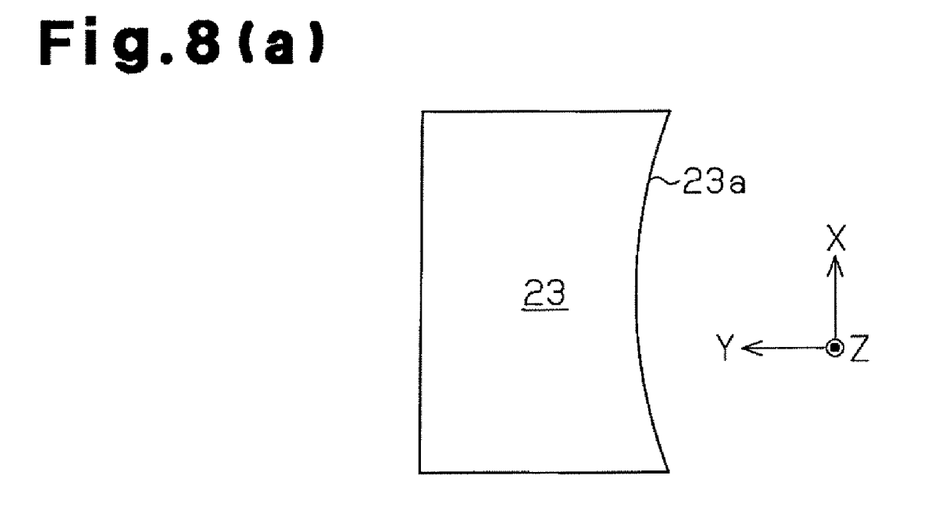
FIG. 8 is a schematic plan view showing the structure of a field stop in the modification of FIG. 7.
Figure 8B:
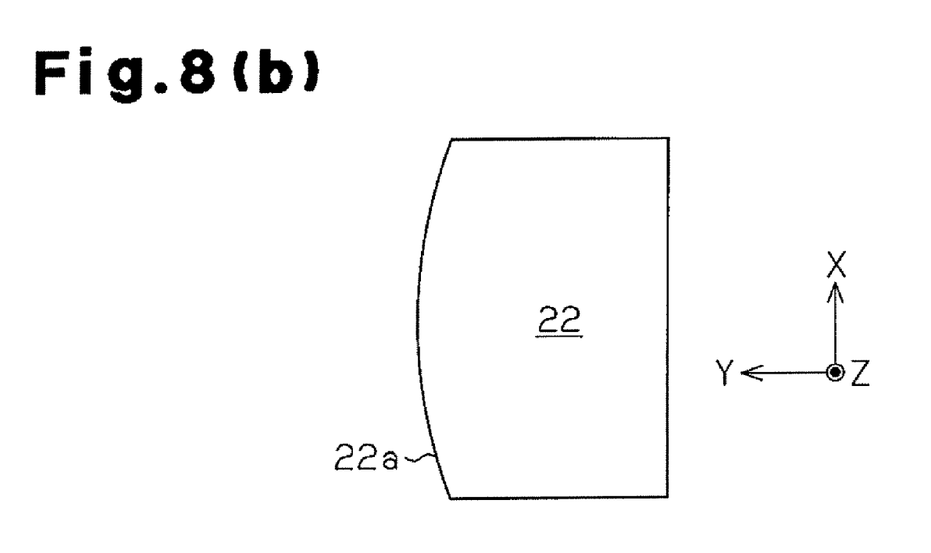

As shown in FIG. 8(a), the first partial field stop 23 includes an edge 23a having a concave arcuate shape in the −Y direction side and arranged to form one arcuate profile line ER1 (see FIG. 4) of the static exposure region ER that is to be formed on the wafer. As shown in FIG. 8(b), the second partial field stop 22 includes an edge 22a having a convex arcuate shape at the +Y direction side and arranged to form the other arcuate profile line ER2 (see FIG. 4) of the static exposure region ER.

In the modification of FIG. 7, the position of the first partial field stop 23 and the position of the second partial field stop 22 are substantially optically conjugated by the relay optical system including the two normal incidence mirrors (19a and 19b) and one oblique incidence mirror (PM). In the same manner as the above-described embodiment, when assuming that the illumination light flux entering the mask M is projected on the mask M to show a projection track of the illumination light flux, and the direction in which the projection track advances is defined as a positive direction (+Y direction in FIG. 7), the second partial field stop 22 is arranged to shield a light flux part located at the negative direction side of the light flux entering the stop 22. In other words, the second partial field stop 22 is arranged to shield the right part of the light flux entering the second partial field stop 22 as viewed in FIG. 7.

However, in a manner differing from the above-described embodiment, the first partial field stop 23 and the second partial field stop 22 are arranged to shield the light flux from opposite sides along the same direction (Y direction). In other words, the first partial field stop 23 is arranged to shield the left part of the light flux, as viewed in FIG. 7, entering the first partial field stop 23 in the optical path between the second fly's eye optical system 18b and the concave reflection mirror 19a.

In the same manner as the above-described embodiment, in the modification of FIG. 7, the first partial field stop 23 and the second partial field stop 22 limit part of the light flux entering the mask M but does not limit the part of the light flux reflected by the mask M. Thus, the limitation of the light flux by the field stops (23, 22) does not adversely affect the imaging of the pattern on the wafer W. Further, the first partial stop field 23 and the second partial field stop 22 are spaced by a certain amount from a position optically conjugated to the wafer W. As a result, the field stops (23, 22) are less likely to be projected onto the wafer W than in the prior art. Furthermore, the exposure amount distribution is less likely to deteriorate than in the prior art.

The structure of the main parts in the illumination optical system 2 of the modification will be described in further detail with reference to FIG. 7. In the modification of FIG. 7, the condenser optical system 19 forming the main part of the illumination optical system 2 includes the concave reflection mirror 19a and the concave reflection mirror 19b arranged in the order in which light enters from the aperture stop AS, which is located at substantially the same position as the reflection plane of the second fly's eye optical system 18b. Further, the planar mirror PM for deflecting the optical path is arranged in the optical path between the condenser optical system 19 and the mask M. FIG. 7 shows a state in which light flux from an infinitely distant object (not shown) first forms an image at the position of the first partial field stop 23 or its vicinity after passing by the aperture stop AS and the second fly's eye optical system 18b and then forms an image again on the mask M after passing by the concave reflection mirror 19a, the concave reflection mirror 19b, and the planar mirror PM. The values of data for the main parts of the illumination optical system 2 related to the modification of FIG. 7 are shown in table (2).

TABLE (2)

| <<<Ray Tracing Set Value>>> | | | | | |
|---|---|---|---|---|---|
| EPD | 166.40000 | | | | |
| XAN | 0.00000 | 0.00000 | 0.00000 | 0.46553 | 0.46553 |
| | 0.46553 | 0.93110 | 0.93110 | 0.93110 | 1.39672 |
| | 1.39672 | 1.39672 | 1.86244 | 1.86244 | 1.86244 |
| YAN | 4.73228 | 4.87602 | 5.01980 | 4.70990 | 4.85364 |
| | 4.99741 | 4.64215 | 4.78588 | 4.92963 | 4.52707 |
| | 4.67077 | 4.81450 | 4.36106 | 4.50473 | 4.64843 |

| <<<Lens Data>>> | | | | |
|---|---|---|---|---|
| | RDY | TH | RMD | GLA |
| OBJ: | INFINITY | INFINITY | | |
| STO: | 969.02213 | 0.000000 | | |
| 2: | 969.02213 | 0.000000 | | 'kari' |
| | SPS XYP: | | | |
| | Y: 1.8641E−05 | X2: 1.6795E−08 | Y2: 1.6041E−08 | |
| | X2Y: 9.4674E−12 | Y3: 9.5880E−12 | X4: 1.3321E−14 | |
| | X2Y2: 2.6141E−14 | Y4: 1.3068E−14 | | |

TABLE (2)-continued

| 3: | 969.09047 | 1008.526172 | | |
|---|---|---|---|---|
| 4: | −378.22928 | −892.008452 | REFL | |
| | XDE: 0.000000 | YDE: −102.782185 | ZDE: 0.000000 | DAR |
| | ADE: 5.643823 | BDE: 0.000000 | CDE: 0.000000 | |
| 5: | 1075.06842 | 1091.760076 | REFL | |
| | XDE: 0.000000 | YDE: −377.314921 | ZDE: 0.000000 | DAR |
| | ADE: 12.445295 | BDE: 0.000000 | CDE: 0.000000 | |
| 6: | INFINTY | 0.000000 | | |
| | XDE: 0.000000 | YDE: −91.614109 | ZDE: 0.000000 | |
| | ADE: 1.755510 | BDE: 0.000000 | CDE: 0.000000 | |
| IMG | INFINTY | 0.000000 | | |

In the illumination optical system 2 of the modification of FIG. 7, the condenser optical system 19 is formed by the concave reflection mirror 19*a*, which has a spherical reflection surface, and the concave reflection mirror 19*b*, which has a spherical reflection surface. The reflection surface of the concave reflection mirror 19*a* and the reflection surface of the concave reflection mirror 19*b* are arranged to be eccentric to the reference axis z extending through the center of the opening in the aperture stop AS and perpendicular to the surface of the aperture stop AS.

In a manner differing from the above-described embodiment, in the modification of FIG. 7, the planar mirror PM for deflecting the optical path is arranged in the optical path between the illumination optical system 2 and the reflective mask M. The optical path of the illumination optical system 2 can be changed without changing the angle of incidence to the mask M by arranging the planar mirror PM, which serves as the oblique incidence mirror, in the optical path between the illumination optical system 2 and the reflective mask M. As a result, in particular, the degree of freedom for mechanical designing becomes high since the illumination optical system 2 can be spaced from the projection optical system PL.

Figure 9:
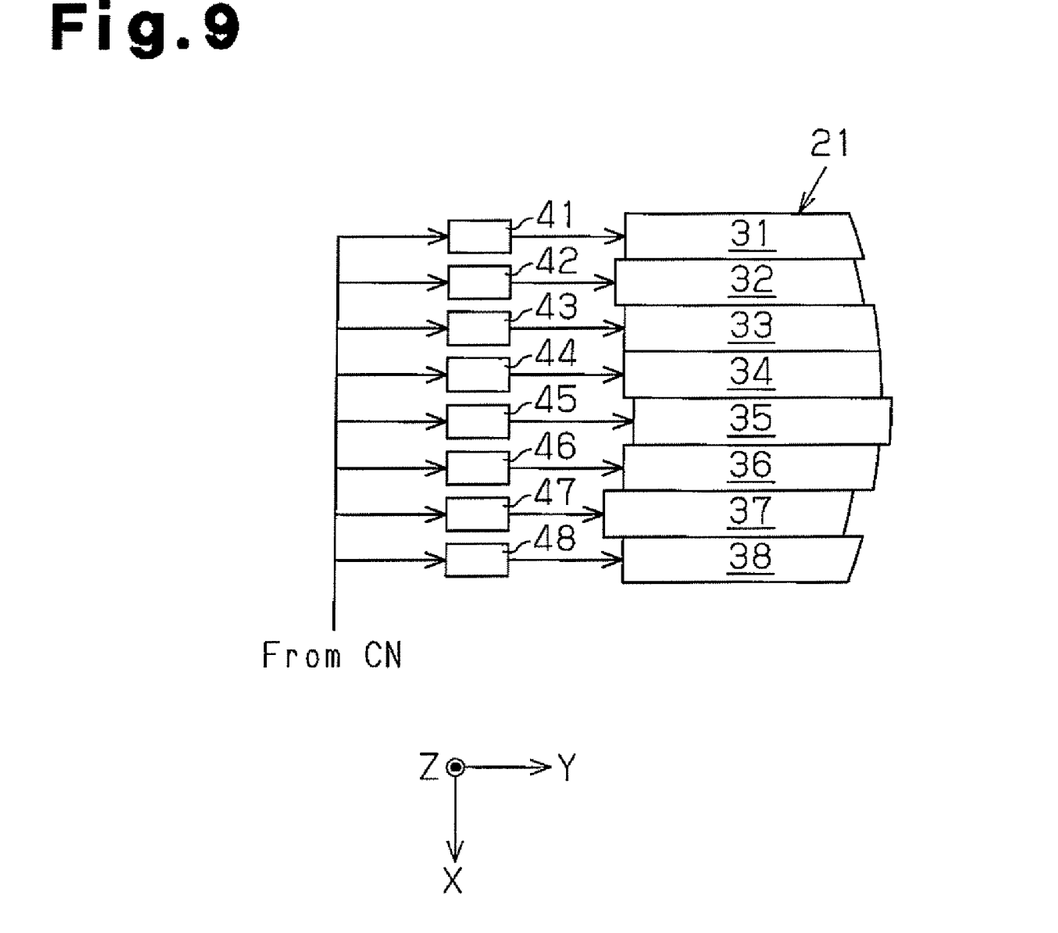
FIG. 9 is a schematic diagram showing an example in which the field stop has a variable edge shape.

In the above-described embodiment, the edge shape of the first partial field stop 21 is variable, for example, as shown in FIG. 9 to further accurately control the exposure amount distribution at the wafer W. In the example of FIG. 9, the first partial field stop 21 is formed by a plurality of (eight are illustrated in FIG. 9) of stop members 31 to 38, which are divided in a scan orthogonal direction (X direction) that is orthogonal to the scanning direction, and eight drive units 41 to 48, which independently drive the eight stop members 31 to 38 along the scanning direction (Y direction).

For example, ultrasonic motors may be used as the drive units 41 to 48. In the example of FIG. 9, the operation of the drive units 41 to 48 is independently controlled in accordance with a command from the controller CN, and the eight stop members 31 to 38 are independently moved along the Y direction to change the edge shape of the first partial field stop 21. As a result, the width dimension in the scanning direction (Y direction) of the static exposure region ER is discretely adjusted for each position along the scan orthogonal direction (X direction), and highly accurate control of the exposure amount distribution for the wafer W is enabled.

The edge shape of the first partial field stop 21 is variable in the example of FIG. 9. However, the present invention is not limited in such a manner. The same control effects may be obtained by varying the edge shape of the second partial field stop 22. However, the second partial field stop 22 is arranged relatively close to the mask M. Thus, a design avoiding mechanical interference between the members is easier to realize when the edge shape of the first partial field stop 21 is variable than when the edge shape of the second partial field stop 22 is variable. A chain type stop such as that disclosed in U.S. Pat. No. 5,895,737 may be used instead of dividing the partial field stop. The disclosure of U.S. Pat. No. 5,895,737 is incorporated herein by reference to the furthest extent allowed by law to supplement the description herein of the present invention.

In the same manner, in the modification of FIG. 7, highly accurate control of the exposure amount distribution for the wafer W is enabled by forming at least one of the first partial field stop 23 and the second partial field stop 22 to have a variable edge shape. In this case, however, the first partial field stop 23 is located between the incident light flux to the concave reflection mirror 19*a* and the reflected light flux from the concave reflection mirror 19*a*. Further, the second partial field stop 22 is arranged relatively close to the mask M. Thus, the design for a variable edge shape is relatively difficult.

The structure and operation of the present invention have been described in the above-described embodiment and the modification based on an example in which the arcuate static exposure region ER is obtained in an image plane of the projection optical system PL. However, the present invention is not limited in such a manner and various modifications are possible with regard to the shape of the static exposure region (illumination region) that is to be formed on a wafer, which is a photosensitive substrate.

In the exposure apparatus according to the above-described embodiment, a micro-device (e.g., semiconductor element, imaging element, liquid crystal display element, and thin-film magnetic head) may be manufactured by illuminating a mask with an illumination system (illumination process) and exposing a transfer pattern formed on the mask onto a photosensitive substrate with a projection optical system (exposure process). One example of the procedures for obtaining a semiconductor device serving as a micro-device by forming a predetermined circuit pattern on a wafer or the like, serving as the photosensitive substrate, with the exposure apparatus of the present embodiment will be described with reference to the flowchart of FIG. 10.

Figure 10:
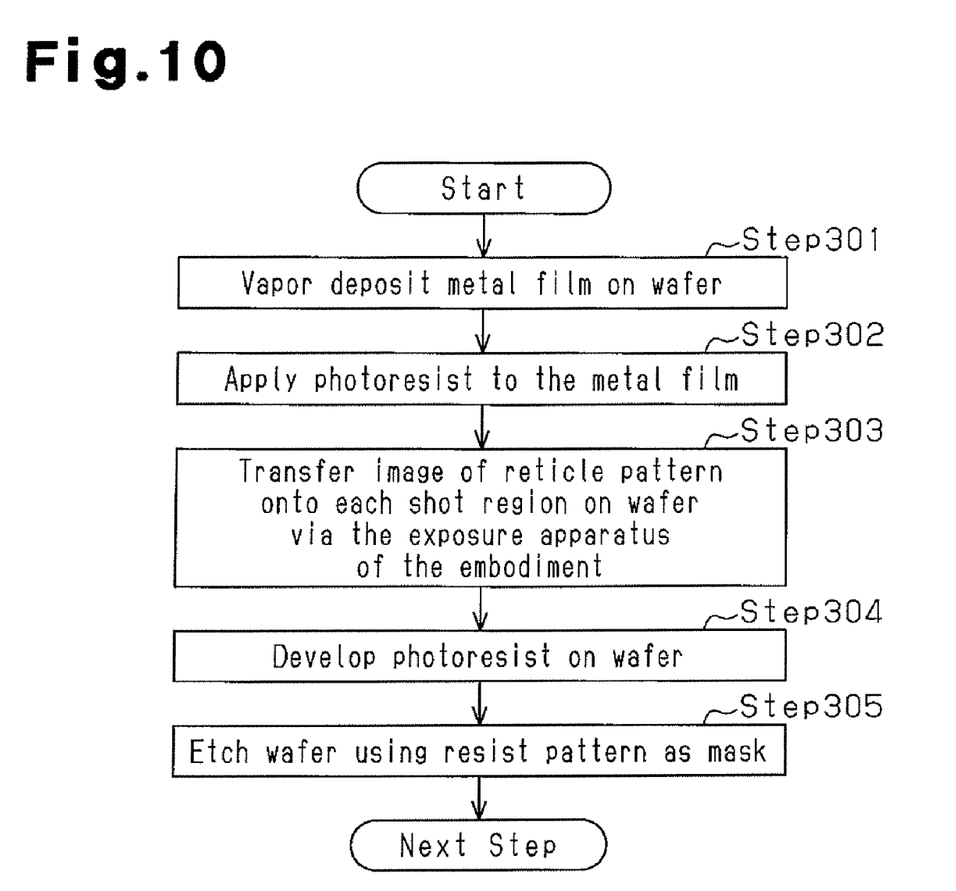
FIG. 10 is a flowchart showing one example of the procedures for obtaining a semiconductor device serving as a micro-device.

First, in step 301 of FIG. 10, a metal film is vapor deposited on a single lot of wafers. Next, in step 302, photoresist is applied to the metal film on the single lot of wafers. Then, in step 303, the image of a pattern on a mask (reticle) is sequentially exposed and transferred to each shot region in the single lot of wafers with the projection optical system using the exposure apparatus of the present embodiment.

After the photoresist on the single lot of wafers is developed in step 304, etching is carried out on the single lot of wafers using a resist pattern as the mask in step 305 so that a circuit pattern corresponding to the pattern on the mask is formed in each shot region of each wafer. The circuit pattern or the like of an upper layer is then formed to manufacture a device such as a semiconductor element. The above-described semiconductor device manufacturing method obtains semiconductor devices having extremely fine circuit patterns with a satisfactory throughput.

The laser plasma light source is used as the light source for supplying the EUV light in the EUVL exposure apparatus of the above-described embodiment. However, the present invention is not limited in such a manner, and other appropriate light sources for supplying the EUV light, such as a synchrotron radiation (SOR) light source and a discharge plasma light source, may be used.

What is claimed is:

1. A reflection type illumination optical apparatus for illuminating an irradiated plane and forming an illumination region on the irradiated plane, the illumination optical apparatus comprising:
an illumination optical system including a plurality of reflection mirrors arranged to guide illumination light flux to the irradiated plane;
a first partial field stop arranged in an optical path of the illumination optical system and forming a first profile line of the illumination region that is to be formed on the irradiated plane; and
a second partial field stop arranged between the illumination optical system and the irradiated plane and forming only a second profile line of the illumination region;
wherein the illumination optical system includes a relay optical system consisting of reflective mirrors, wherein the relay optical system is arranged in an optical path between the first partial field stop and the second partial field stop and substantially optically conjugates a position of or the vicinity of the first partial field stop and a position of or the vicinity of the second partial field stop.

2. The illumination optical apparatus according to claim 1, wherein when assuming that the illumination light flux entering the irradiated plane is projected on the irradiated plane to show a projection track of the illumination light flux, and the direction in which the projection track is defined as a positive direction, the second partial field stop is arranged to shield only a light flux part that is located at a negative direction side of the light flux entering the irradiated plane.

3. The illumination optical apparatus according to claim 2, wherein the first partial field stop is arranged to shield a light flux part that is located at a positive direction side of the light flux entering the irradiated plane.

4. The illumination optical apparatus according to claim 1, wherein the relay optical system includes only two normal incidence mirrors.

5. The illumination optical apparatus according to claim 1, wherein the first partial field stop and the second partial field stop are arranged to define the illumination light flux from the same side.

6. The illumination optical apparatus according to claim 1, wherein:
the illumination optical apparatus is applied to a scanning exposure apparatus that scans and exposes along the scanning direction,
the first partial field stop forms the first profile line corresponding to the scanning direction; and
the second partial field stop forms only the second profile line corresponding to the scanning direction.

7. The illumination optical apparatus according to claim 1, wherein the reflective mirrors of the relay optical system includes two normal incident mirrors and an oblique incidence mirror arranged between the two normal incident mirrors and the second partial field stop.

8. An exposure apparatus that exposes a pattern of a reflective raw plate on an object, the exposure apparatus comprising:
an illumination optical apparatus according to claim 1.

9. A device manufacturing method comprising:
exposing a pattern of the reflective raw plate on the photosensitive substrate using the exposure apparatus according to claim 8; and
developing the photosensitive substrate that has undergone the exposing.

10. The illumination optical apparatus according to claim 1, wherein:
the illumination optical system forms an arcuate illumination region on the irradiated plane, the arcuate illumination region including arcuate profile lines;
the first partial field stop forms one of the arcuate profile lines of the arcuate illumination region that is to be formed on the irradiated plane; and
the second partial field stop forms only the other one of the arcuate profile lines of the arcuate illumination region that is to be formed on the irradiated plane.

11. The illumination optical apparatus according to claim 1, wherein the first partial field stop includes a plurality of stop members and a drive unit which drives at least one of the stop members to change the first profile line of the illumination region.

12. An exposure apparatus that exposes illumination light on an object via a reflective mask, which includes a pattern surface arranged parallel to a predetermined surface including first and second directions that are normal to each other, and a projection optical system, the exposure apparatus comprising:
an illumination optical system including a plurality of reflection mirrors, which are arranged in the first direction relative to the reflective mask to obliquely illuminate the reflective mask with the illumination light to form an illumination region including a longitudinal axis in the second direction on the pattern surface of the reflective mask, the illumination region including a pair of profile lines extending along the second direction;
a first partial field stop arranged in the illumination optical system and forming a light emitting side profile line of the profile lines of the illumination region in the first direction; and
a second partial field stop arranged in the vicinity of the mask and forming only a light entering side profile line of the profile lines of the illumination region in the first direction.

13. The exposure apparatus according to claim 12, wherein the illumination light from the first partial field stop enters the second partial field stop via at least one of the plurality of reflection mirrors.

14. The exposure apparatus according to claim 12, wherein the reflective mask and the object each are moved when performing a scanning exposure to the object, and wherein the reflective mask is moved in the first direction when performing the scanning exposure.

15. The exposure apparatus according to claim 12, wherein each of the pair of profile lines is an arcuate profile line.

16. The exposure apparatus according to claim 12, wherein the illumination optical system includes a relay optical system consisting of reflective mirrors, wherein the relay optical system optically conjugates a position of or the vicinity of the first partial field stop and a position of or the vicinity of the second partial field stop.

17. The exposure apparatus according to claim 12, wherein the first partial field stop includes a plurality of stop members and a drive unit which drives at least one of the stop members to change the shape of the illumination region that is to be formed on the reflective mask.

18. A device manufacturing method comprising:
exposing a substrate using the exposure apparatus according to claim 12; and
developing the substrate that has undergone the exposing.

* * * * *